United States Patent
Ksienski et al.

(10) Patent No.: US 7,256,649 B2
(45) Date of Patent: Aug. 14, 2007

(54) MULTIPLE SIGNAL INTERMODULATION REDUCTION SYSTEM

(75) Inventors: David A. Ksienski, Los Angeles, CA (US); Keven S. MacGowan, Rancho Palos Verdes, CA (US); Samuel S. Osofsky, Rancho Palos Verdes, CA (US); Albert M. Young, Whittier, CA (US); Thomas T. Tam, Huntington Beach, CA (US)

(73) Assignee: The Aerospace Corporation, El Segundo, CA (US)

( * ) Notice: Subject to any disclaimer, the term of this patent is extended or adjusted under 35 U.S.C. 154(b) by 157 days.

(21) Appl. No.: 11/057,979

(22) Filed: Feb. 15, 2005

(65) Prior Publication Data

US 2006/0181344 A1   Aug. 17, 2006

(51) Int. Cl.
   *H03F 3/68*   (2006.01)
   *H04L 25/49*   (2006.01)
(52) U.S. Cl. .................................. 330/124 R; 375/296
(58) Field of Classification Search .............. None
   See application file for complete search history.

(56) References Cited

U.S. PATENT DOCUMENTS

| | | | | |
|---|---|---|---|---|
| 4,131,859 A | * | 12/1978 | Valle | 330/124 R |
| 4,217,554 A | * | 8/1980 | Brzozowski | 330/124 R |
| 4,656,434 A | * | 4/1987 | Selin | 330/84 |
| 5,764,104 A | * | 6/1998 | Luz | 330/124 R |
| 6,268,768 B1 | * | 7/2001 | Blodgett | 330/107 |

* cited by examiner

*Primary Examiner*—Robert Pascal
*Assistant Examiner*—Krista M Flanagan
(74) *Attorney, Agent, or Firm*—Derrick Michael Reid

(57) ABSTRACT

An intermodulation product reduction or cancellation amplifier received two input signals that are split in quadrature wherein the inphase outputs are summed and then amplified as an inphase signal, and the quadrature outputs are fixed-phase phase-shifted, then summed and then amplified as a quadrature signal. The inphase and quadrature signals are fed into an output hybrid for canceling intermodulation products, where the fixed-phase phase shift is +/−60° for reducing 3rd order, +/−36° for reducing 5th order, and +/−25.71° for reducing 7th order intermodulation products, for examples, for improved signal communications of the two signals over a common antenna or link.

19 Claims, 4 Drawing Sheets

INTERMODULATION CANCELLATION AMPLIFIER

INTERMODULATION CANCELLATION AMPLIFIER

INTERMODULATION CANCELLATION ANTENNA
TRANSCEIVER SYSTEM

THREE SIGNAL INTERMODULATION CANCELLATION AMPLIFIER

MULTIPLE SIGNAL INTERMODULATION REDUCTION SYSTEM

STATEMENT OF GOVERNMENT INTEREST

The invention was made with Government support under contract No. F04701-00-C-0009 by the Department of the Air Force. The Government has certain rights in the invention.

FIELD OF THE INVENTION

The invention relates to the field of antenna communication systems. More particularly, the present invention relates to intermodulation reduction when transmitting or receiving two signals in communication systems.

BACKGROUND OF THE INVENTION

Space-based phased arrays composed of hundreds of elements can be used for microwave communications systems. The phased-array design allows for rapid placement of the beam and rapid adjustment of beam characteristics to avoid jamming. Also, phased arrays degrade gracefully and demonstrate general, flexibility unlike a dish antenna with a fixed beam. Efficiency of the phased array is one important design consideration. Phased arrays usually transmit one signal at any one time. In order to operate in the most efficient manner, the RF amplifiers in the phased array are operated well into compression, which is also near the point of maximum efficiency. Deep compression means that the output power does not change when relatively large changes in input power are made. Phased-array designs often trade amplifier linearity for efficiency as required.

The ability to transmit two or more signals simultaneously through a phased array would directly increase the information carrying capacity of a space-based communication system. However, the transmission of multiple signals could generate in-band intermodulation products. The intermodulation products are due to the amplifiers operating in compression. The amplifiers are operated in compression to keep the efficiency high. Unfortunately, mixing of the signal components within the amplifier when operated in saturation would cause the amplifier output signals to contain large undesirable intermodulation products. These intermodulation products would then produce spurious transmitting beams that could compromise the security of the main transmit channels. The intermodulation distortion in phased-array amplifiers degrades system communications. Intermodulation products can interfere with other desired transmitted signals. Intermodulation products can exceed the specified power level for out-of-band emissions. Intermodulation products can interfere with other users. And, intermodulation products may contribute to interception by unwanted listeners. Reducing the intermodulation products produced within the amplifiers would preserve the signal fidelity, thus making the phased arrays useful in a multiple carrier system.

The conventional nonlinear operation of the amplifiers precludes sending multiple signals simultaneously through them. If this were to be done, large intermodulation products, usually of odd order, such as the $3^{rd}$, $5^{th}$, and $7^{th}$ order would be produced. The frequencies of the odd-order intermodulation products are in-band, and would be transmitted to the ground. The transmission of these intermodulation products is likely to exceed constraints on spurious emission levels. Thus, the phased array is usually limited to transmitting a single signal at a time.

The two-tone input signal to an amplifier can be written in the following form: $V=\sin(\omega_1 t + \phi_1) + \sin(\omega_2 t + \phi_2)$. A nominal model of the amplifier transfer function can be written as a polynomial, $vout = GV + \eta_1 V^3 + \eta_2 V^5 + \eta_3 V^7$, where vout is the output signal. The inband output signal produced by the amplifier consists of several frequency terms, including the linear terms, $\sin(\omega_1 t + \phi_1)$, $\sin(\omega_2 t + \phi_2)$, the 3rd order intermodulation products, $\sin((2\omega_2 - \omega_1)t + \alpha)$, $\sin((2\omega_1 - \omega_2)t + \beta)$, and the 5th order intermodulation products, $\sin((3\omega_2 - 2\omega_1)t + \gamma)$, $\sin((3\omega_1 - 2\omega_2)t + \delta)$, as well as higher order intermodulation products. The intermodulation product terms decrease in amplitude for each successive order. The most significant intermodulation product term is usually the 3rd order.

Traditional linearization techniques, such as feed forward, digital predistortion, and feedback methods, are routinely applied in order to improve the performance of communication systems that use a single main amplifier. A transmitter designer may select which single or which combination of linearization techniques must be used in order to make possible the transmission of multiple signals. Because the single large amplifier will use most of the DC input power in the system, this amplifier usually sets the overall system efficiency. The extra circuitry needed to implement predistortion or feedback linearization may not significantly degrade the overall efficiency of such a system. The feed forward technique, however, may produce a severe reduction in efficiency. A phased array, on the other hand, contains a large number of amplifiers. If the traditional single-amplifier linearization techniques were applied to the phased array, a large number of linearization circuits would be required. The negative impact on system efficiency, weight, power, and size would render the system impractical.

RF circuits have been developed that specifically cancel intermodulation products that are generated by the interaction of a transmitted signal with an interfering signal introduced at the output port of the transmitter. These RF circuits are typical balanced amplifier designs. In this case, the intermodulation products are generated in the output circuits of the amplifiers, and then reradiated. The intermodulation products that would normally be produced in the amplifiers are reduced by means of an appropriate phase-shifting and combining network at the amplifier outputs. In order to maintain the required output power level of the desired signal, an input splitting and phase-shifting network is also required. This method does not however cancel intermodulation tones generated by the presence of two signals introduced at the amplifier input port. The above described RF circuits can only amplify one signal at a time and still cancel intermodulation products at the output port. These and other disadvantages are solved or reduced using the invention.

SUMMARY OF THE INVENTION

An object of the invention is to provide a system for reducing intermodulation products of two amplified signals.

Another object of the invention is to provide a system for reducing intermodulation products using fixed phase shifters.

Yet another object of the invention is to provide a transmitter for reducing intermodulation products using fixed phase shifters.

Still another object of the invention is to provide a receiver for reducing intermodulation products using fixed phase shifters.

A further object of the invention is to provide a transceiver for reducing intermodulation products using fixed phase shifters during reception or transmission.

Yet a further object of the invention is to provide a transceiver for reducing intermodulation products using fixed phase shifters during reception or transmission of two signals.

The present invention is directed to an intermodulation reduction amplifier that can significantly reduce the level of these unwanted intermodulation products. Each of the two input signals is split using quadrature hybrids, thus producing four signals including two quadrature signals and two inphase signals. The two quadrature signals have been shifted by 90 degrees from the two inphase signals. The two inphase signals are combined and used as a reference signal. The phases of the quadrature signals are individually phase shifted. These phase-adjusted signals are then combined, which produces a phase-shifted composite signal. The reference signal is fed to one of two identical amplifiers, and the phased shifted signal is fed to the other. The amplifier output signals from each amplifier are then combined using another quadrature hybrid for producing a composite output signal in which the levels of one order of intermodulation products are significantly reduced. The intermodulation reduction amplifier can be used in a transmitter or a receiver, or combined in a transceiver. These and other advantages will become more apparent from the following detailed description of the preferred embodiment.

DETAILED DESCRIPTION OF THE PREFERRED EMBODIMENT

Figure 1:
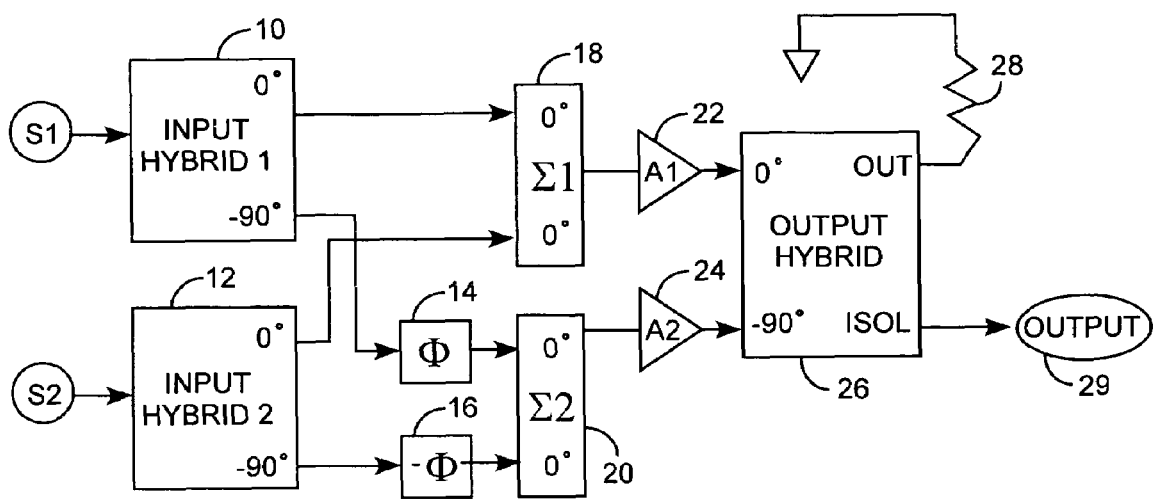
FIG. 1 is a schematic of an intermodulation cancellation amplifier.

An embodiment of the invention is described with reference to the figures using reference designations as shown in the figures. Referring to FIG. 1, a balanced amplifier topology is shown for amplifying two input signals S1 and S2 into respective first and second hybrids 10 and 12. Each of the quadrature hybrids 10 and 12 have a 0° inphase output and 90° quadrature output. The 90° quadrature outputs from hybrids 10 and 12 are respectively routed to a Φ first fixed phase shifter 14 and −Φ second fixed phase shifter 16. The 0° inphase outputs are not phase shifted but summed by a first summer 18 for providing a summed inphase output, that in turn, is amplified by a first amplifier 22 for providing an amplified inphase output. The Φ and −Φ phased shifted quadrature signals are summed by a second summer 20 for providing a summed quadrature output, that in turn, is amplified by a second amplifier 24 for providing an amplified quadrature output. The amplified inphase and quadrature outputs are fed into an output hybrid 26 having the inphase output terminated by a load 28 with a quadrature output being an intermodulation cancellation amplifier output 29. The output quadrature hybrid 26 combines the amplified inphase and quadrature outputs into the interinodulation cancellation amplifier output 29. The use of two input hybrids 10 and 12 and the output hybrid 26 isolate the amplifiers 22 and 24 from each other, and are used to generate higher output powers using lower-powered amplifiers 22 and 24 by themselves.

Figure 2:
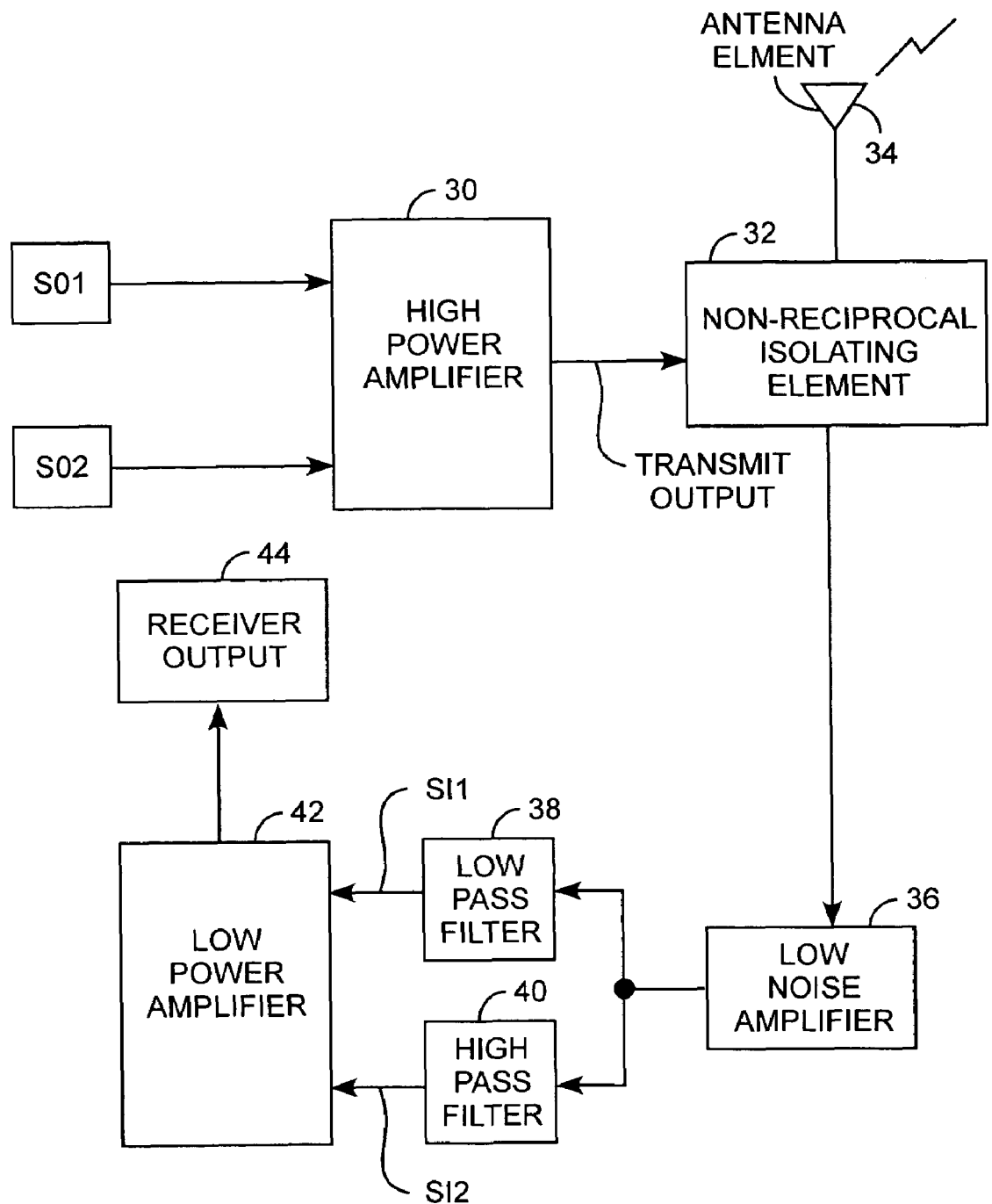
FIG. 2 is a block diagram of an intermodulation cancellation antenna transceiver system.

Referring to FIGS. 1 and 2, and more particularly to FIG. 2, the intermodulation cancellation amplifiers can be used in a transceiver for both transmission and reception. Input signals SO1 and SO2 are fed into a high power amplifier that can be a intermodulation cancellation amplifier for providing a transmit output that is fed into a nonreciprocal isolating element 32 for transmitting the two output signals SO1 and SO2 over an antenna 34. The antenna 34 can also receive an input signal that is fed through the nonreciprocal isolating element 32 to a low noise amplifier 36. The amplified input signal can be passed through two filters including a low pass filter 38 and a high pass filter 40 for respectively providing two input signals SI1 and SI2. The two input signals SI1 and SI2 are then fed into a low power amplifier 42 that can be an intermodulation cancellation amplifier for providing an input as a receiver output. Hence, an intermodulation cancellation amplifier can be used for both transmission and reception in an intermodulation cancellation antenna transceiver system.

Figure 3:
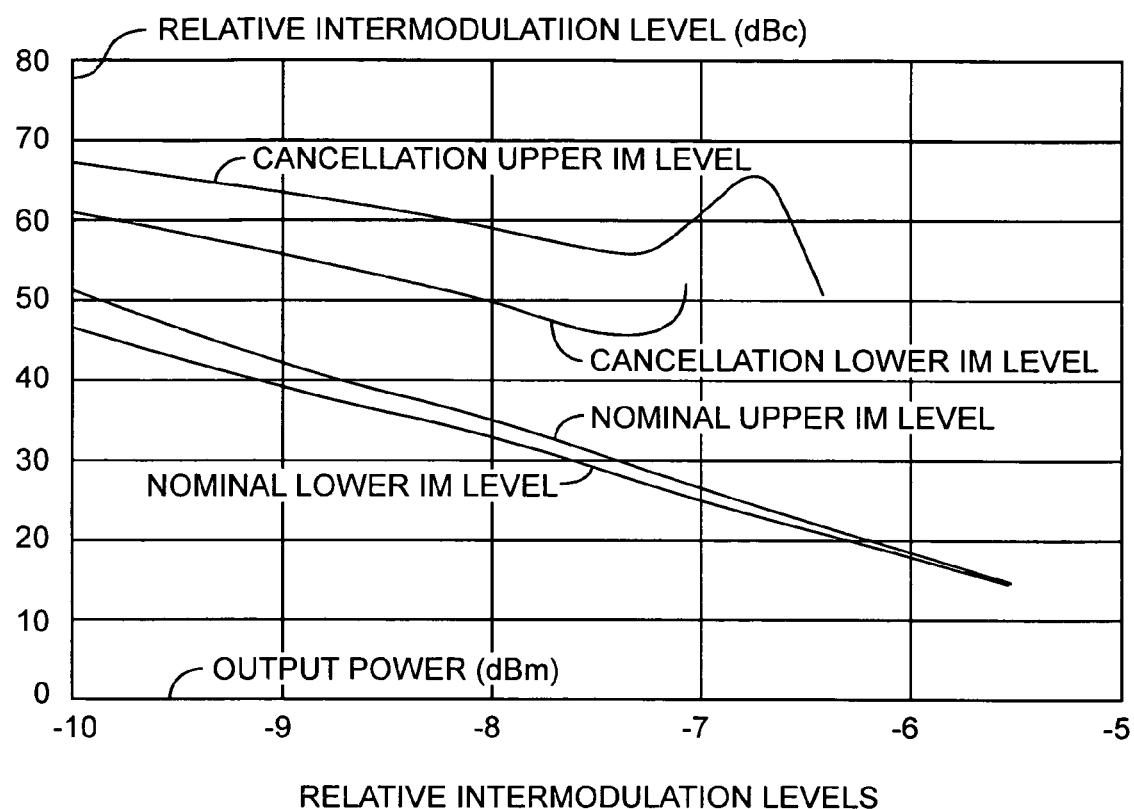
FIG. 3 is a graph of lower and upper intermodulation levels.

Referring to all of the Figures, and particularly to FIG. 3, the cancellation of the upper intermodulation product and the cancellation of the lower intermodulation product is reduced over output power levels. In an exemplar operation, the signals S1 and S2 are inputs to the two input hybrids 10 and 12 that function as quadrature splitters. The input signals S1 and S2 can be referenced by symbols S1 or S2 at a relative angle of the signal in degrees. The output signals of the splitting hybrid 10 respectively are S1(0°) and S1(−90°), and the outputs of the other splitting hybrid are S2(0°), and S2(−90°). Factors of $1/\sqrt{2}$ that are produced by the splitting and combining process are not included for clarity. The output of the first summer 18 is S1(0°) +S2(0°), which is then fed to the first amplifier 22. The Φ first phase shifter 14 is set at +60° degrees and is applied to S1(−90°) first quadrature output, thus generating the Φ phase shifted quadrature signal that is S1(−30°). The −Φ second phase shifter 16 is set at −60° degrees and is applied to S2(−90°) second quadrature output, thus generating the −Φ phase shifted quadrature signal at S2(−150°). These two differently phase-shifted signals, the Φ and −Φ phase shifted quadrature signals are then combined in the second zero-degree summer 20 and fed to the second amplifier 24. The +/−60 degree phase shifts by the phase shifters 14 and 16 are optimized in order to cancel the 3rd order intermodulation products. Alternate phase shifts of the shifters 14 and 16 can be set for optimal cancellation of other higher order intermodulation products. For example, applying phase shifts of +/−36 degrees in a similar manner would cause the 5th order harmonic to be cancelled. For example, applying phase shifts of +/−26 degrees in a similar manner would cause the 7th order harmonic to be cancelled. Also, the phase shifts of the shifters 14 and 16 can be swapped as desired, that is, the −60° phase shift could be applied by shifter 14 and the +60° phase shift could be applied by the shifter 16, for producing the same 3rd order intermodulation cancellation.

The intermodulation product cancellation amplifier can be used whenever two signals from separate sources are to be amplified and combined. The intermodulation cancellation amplifier combines constructively the desired signals S1 and S2 while the unwanted intermodulation products combine destructively. The two outputs of the two zero-degree summers 18 and 20 are inputs to preferably two identical amplifiers 22 and 24. The outputs of the amplifiers 22 and 24 primarily consist of amplified versions of the input signals that are the desired signals. However, because of the nonlinear nature of the gain of the amplifiers gain and phase transfer function, intermodulation products are also present at the output of the amplifiers 22 and 24. The relative phases of the desired signals at the output of first amplifier 22 are 0°, while the phases of the desired signals at the output of second amplifier are −30° and −150°. The output of the first amplifier 22 is connected to the nominal inphase input of the output hybrid 26, while the output of the second amplifier 24 is connected to the nominal quadrature input of the output hybrid 26. However, when the output power is measured at the nominal isolated port of the output hybrid 26, then the signals at the inphase input experience a relative −90° phase shift, while those at the quadrature input experience a relative 0° phase shift. Consequently, the desired output signals combine 60 degrees out of phase, and suffer a theoretical 1.25 dB reduction in available output power relative to the typical balanced amplifier. The undesired intermodulation products at the outputs of the first and second amplifiers 22 and 24 differ in phase by 90°. Because of the additional phase shift of the output hybrid 26, the intermodulation products combine 180° out of phase, and ideally sum to zero power, thereby canceling the undesired intermodulation products. Small amplitude and phase imbalances will cause the destructive summation to be imperfect.

Figure 4:
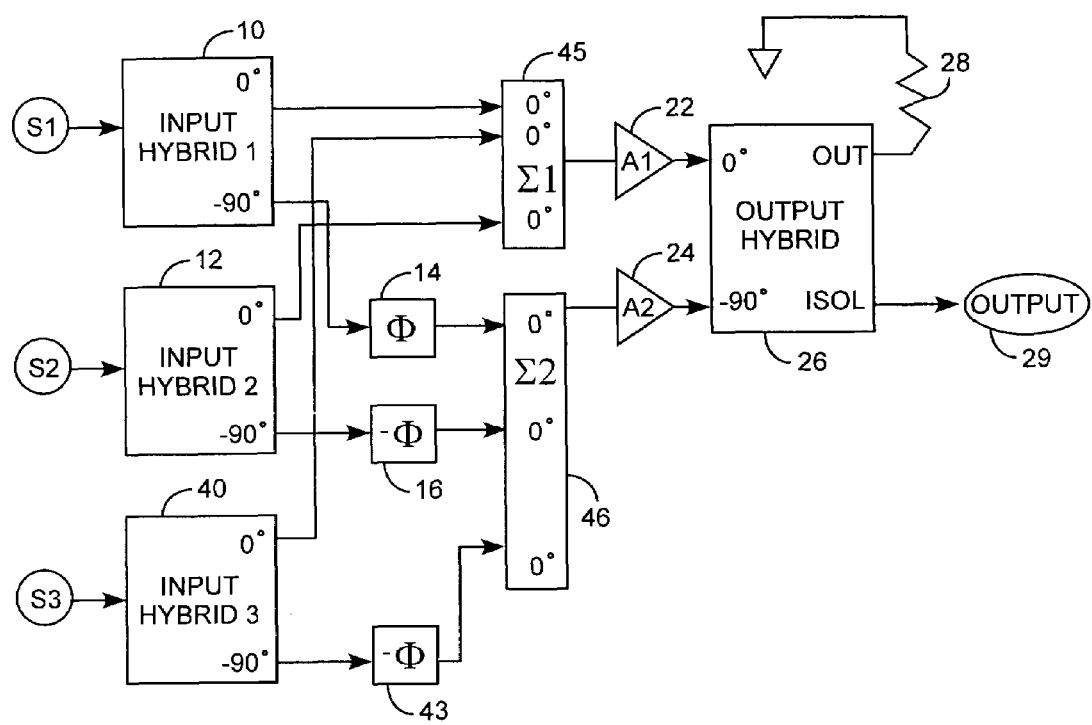
FIG. 4 is a block diagram of a three signal intermodulation cancellation amplifier.

Referring to all of the FIGS., and particularly to FIG. 4, the cancellation of the upper intermodulation product and the cancellation of the lower intermodulation product is reduced over output power levels. In an exemplar operation, the signals S1, S2, and S3 are inputs to the three input hybrids 10, 12, and 43 that function as quadrature splitters. The input signals S1, S2, and S3 can be referenced by symbols S1, S2, or S3 at a relative angle of the signal in degrees. The output signals of the splitting hybrid 10 respectively are S1(0°) and S1(−90°), the outputs of the splitting hybrid 12 are S2(0°), and S2(−90°), and the outputs of the splitting hybrid 40 are S3(0°), and S3(−90°). Factors of $1/\sqrt{2}$ that are produced by the splitting and combining process are not included for clarity. The output of the first summer 45 is S1(0°) +S2(0°) +S3(0°), which is then fed to the first amplifier 22. The Φ first phase shifter 14 is set at +60° degrees and is applied to S1(−90°) first quadrature output, thus generating the Φ phase shifted quadrature signal that is S1(−30). The −Φ second phase shifter 16 is set at −60° degrees and is applied to S2(−90°) second quadrature output, thus generating the −Φ phase shifted quadrature signal at S2(−150°). The Φ third phase shifter 43 is set at 60° degrees and is applied to S3(−90°) third quadrature output, thus generating the −Φ phase shifted quadrature signal at S3(−30°).

These three differently phase-shifted signals, the Φ, Φ, and −Φ) for phase shifters 14, 43, and 16 phase shift the quadrature signals. The phase shifted signals are then combined in the second zero-degree summer 46 and fed to the second amplifier 24. The +/−60 degree phase shifts by the phase shifters 14, 16, and 43 are optimized in order to cancel the 3rd order intermodulation products. Alternate phase shifts of the shifters 14, 16, and 43 can be set for optimal cancellation of other higher order intermodulation products. For example, applying phase shifts of +1 −36 degrees in a similar manner would cause the 5th order harmonic to be cancelled. For example, applying phase shifts of +/−26 degrees in a similar manner would cause the 7th order harmonic to be cancelled. Also, the phase shifts of the shifters 14 and 16 can be swapped as desired, as well the phase shifts of the shifters 16 and 43 can be swapped as desired. For example −60° phase shift could be applied by shifters 14 and 43 and the +60° phase shift could be applied by the shifter 16, for producing the same 3rd order intermodulation cancellation.

The intermodulation product cancellation amplifier can be used whenever three signals from separate sources are to be amplified and combined. The intermodulation cancellation amplifier combines constructively the desired signals S1, S2, and S3, while the unwanted intermodulation products combine destructively. The two outputs of the two zero-degree summers 45 and 46 are inputs to preferably two identical amplifiers 22 and 24. The outputs of the amplifiers 22 and 24 primarily consist of amplified versions of the input signals that are the desired signals. However, because of the nonlinear nature of the gain of the amplifiers gain and phase transfer function, intermodulation products are also present at the output of the amplifiers 22 and 24. The relative phases of the desired signals at the output of first amplifier 22 are 0°, while the phases of the desired signals at the output of second amplifier are −30° and −150°. The output of the first amplifier 22 is connected to the nominal inphase input of the output hybrid 26, while the output of the second amplifier 24 is connected to the nominal quadrature input of the output hybrid 26. However, when the output power is measured at the nominal isolated port of the output hybrid 26, then the signals at the inphase input experience a relative −90 phase shift, while those at the quadrature input experience a relative 0° phase shift. Consequently, the desired output signals combine 60 degrees out of phase, and suffer a theoretical 1.25 dB reduction in available output power relative to the typical balanced amplifier. The undesired intermodulation products at the outputs of the first and second amplifiers 22 and 24 differ in phase by 90°. Because of the additional phase shift of the output hybrid 26, the intermodulation products combine 180° out of phase, and ideally sum to zero power, thereby canceling the undesired intermodulation products. Small amplitude and phase imbalances will cause the destructive summation to be imperfect. The amplifier can be applied to input signals of two or more, and the phase shifters could be tunable phase shifters for tunable control.

The relative level of the intermodulation product as a function of output power can be compared to the intermodulation performance of the typical balanced amplifier. The maximum output power of the new topology is approximately 1.25 dB less than that of the typical balanced amplifier. The exemplar backoff levels of 1 dB compared to 1.6 dB are caused by imbalances in the input power to each amplifier. If the operating point of the first and second amplifiers 22 and 24 in a nominal balanced amplifier configuration were backed off so that the output power were reduced by 1.3 dB, the level of the intermodulation tones would be approximately −26 dBc, or 26 dB lower in power than the single tone power. The intermodulation cancellation amplifier generates the same output power but also produces 3rd-order intermodulation products 24 dB to 29 dB lower in level relative to the performance of the typical balanced amplifier design. Furthermore, the amplifiers of this method could be operating in deep compression near the highest possible efficiency. A dual-signal phased array system would require that some linearization method, or require that the output amplifier be operated with significant output power backoff. This backoff would adversely affect both absolute output power and efficiency. The intermodulation product cancellation amplifier decreases the level of the intermodulation products by at least 20 dB with a cost of only 1.3 dB in output power reduction. An unlinearized amplifier would have to be backed off by 4.5 dB in order to generate the same power level of intermodulation products. Furthermore, using the intermodulation product cancellation amplifier, the amplifiers 22 and 24 can be operated near the maximum efficiency. The additional circuitry that is required to implement the intermodulation product cancellation amplifier can be manufactured as a monolithic integrated circuit and easily integrated into a phased-array design. Use of two signals through a phased array system could affect the need to put two phased arrays on one satellite. Use of two signals through a phased array could affect the need to procure a second satellite.

The present invention is directed to an intermodulation product cancellation amplifier using fixed phase shifting for canceling intermodulation products generated when combined signals are amplified. The phase shifts are +/−60° for reducing 3rd order intermodulation products, +/−36° for reducing 5th order intermodulation products, +/−25.71° for reducing 7th order intermodulation products, as well as higher order intermodulation products having respective fixed phase shifts. The intermodulation product cancellation amplifier can be applied in antenna system for communicating two signals with reduced intermodulation products. Those skilled in the art can make enhancements, improvements, and modifications to the invention, and these enhancements, improvements, and modifications may nonetheless fall within the spirit and scope of the following claims.

What is claimed is:

1. An intermodulation product reduction system for canceling intermodulation products when amplifying input signals, the intermodulation product reduction amplifier comprising,
    splitters for respectively receiving the input signals for providing respective inphase and quadrature signals for each of the input signals,
    phase shifters for phase shifting the quadrature signals for providing phase shifted signals,
    a first summer for summing the inphase signals for providing a first summed signal,
    a second summer for summing the phase shifted signals for providing a second summed signal,
    a first amplifier for amplifying the first summed signal into a first amplified signal,
    a second amplifier for amplifying the second summed signal into a second amplified signal, and
    an output hybrid for quadrature phase shifting one of the first and second amplified signals relative to the other and for combining the first and second amplified signals for providing an output signal having the input signals and for canceling the intermodulation products.

2. The system of claim 1 wherein,
    the splitters are quadrature hybrids.

3. The system of claim 1 wherein,
    the input signals are three input signals, and
    the phase shifters are three phase shifters.

4. The system of claim 1 wherein,
    the input signals are three input signals,
    the phase shifters are three phase shifters, and
    the three phase shifter phase shift at +/−60 degrees for canceling third order intermodulation products.

5. The system of claim 1 wherein,
    the input signals are three input signals,
    the phase shifters are three phase shifters, and
    the three phase shifter phase shift at +/−36 degrees for canceling fifth order intermodulation products.

6. The system of claim 1 wherein,
    the input signals are three input signals,
    the phase shifters are three phase shifters, and
    the three phase shifter phase shift at +/−25.71 degrees for canceling seventh order interinodulation products.

7. An intermodulation product reduction system for canceling intermodulation products when amplifying a first input signal and a second input signal, the intermodulation product reduction amplifier comprising,
    a first splitter for splitting in quadrature the first input signal for providing an first inphase signal and a first quadrature signal,
    a second splitter for splitting in quadrature the second input signal for providing an second inphase signal and a second quadrature signal,
    a first phase shifter for phase shifting the first quadrature signal by X degrees for providing a first phase shifted quadrature signal,
    a second phase shifter for phase shifting the second quadrature signal by −X degrees for providing a second phase shifted quadrature signal,
    a first summer for summing the first inphase signal and the second inphase signal for providing a first summed signal,
    a second summer for summing the first phase shifted quadrature signal and the second phase shifted quadrature signal for providing a second summed signal,
    a first amplifier for amplifying the first summed signal into a first amplified signal,
    a second amplifier for amplifying the second summed signal into a second amplified signal, and
    an output hybrid for quadrature phase shifting one of the first and second amplified signals relative to the other and for combining the first and second amplified signals for providing an output signal having the first and second inputs and for canceling Y-order intermodulation products.

8. The system of claim 7 wherein,
    the Y-order intermodulation products are the 3rd order intermodulation products, and
    the X degrees fixed phase shift is 60°.

9. The system of claim 7 wherein,
    the Y-order intermodulation products are the 5th order intermodulation products, and
    the X degrees fixed phase shift is 36°.

10. The system of claim 7 wherein,
    the Y-order intermodulation products are the 7th order intermodulation products, and
    the X degrees fixed phase shift is 25.71°.

11. The system of claim 7 wherein,
    the first and second splitters are hybrids.

12. The system of claim 7 wherein,
    the first and second amplifiers are operated in compression.

13. The system of claim 7 wherein,
    the first and second summers have equal phase shifts.

14. The system of claim 7 wherein,
    the first and second summers have zero phase shifts.

15. The system of claim 7 wherein,
    the first and second amplifiers have equal amplification levels.

16. The system of claim 7 wherein,
    the Y-order intermodulation products are the 3rd order intermodulation products, the X degrees fixed phase shift is 60°,
the first and second amplifiers are operated in compression, and
the 3rd order intermodulation products are reduced by 20 dB.

17. The system of claim 7 wherein,
the system effectively operates backed off.

18. The system of claim 7 wherein,
the system effectively operates backed off by 1.25 dB.

19. The system of claim 1 wherein,
the input signals are a first input signal and a second input signal.

* * * * *